United States Patent
Sunaga et al.

(10) Patent No.: US 7,093,067 B2
(45) Date of Patent: Aug. 15, 2006

(54) DRAM ARCHITECTURE ENABLING REFRESH AND ACCESS OPERATIONS IN THE SAME BANK

(75) Inventors: Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 10/473,875

(22) PCT Filed: Mar. 6, 2002

(86) PCT No.: PCT/JP02/02092

§ 371 (c)(1),
(2), (4) Date: Sep. 30, 2003

(87) PCT Pub. No.: WO02/082455

PCT Pub. Date: Oct. 17, 2002

(65) Prior Publication Data

US 2004/0133735 A1    Jul. 8, 2004

(30) Foreign Application Priority Data

Mar. 30, 2001    (JP)    ............................. 2001-097911

(51) Int. Cl.
*G11C 4/06*    (2006.01)
*G06F 12/16*    (2006.01)
(52) U.S. Cl. ................. 711/106; 365/222; 365/194; 365/189.04; 711/150
(58) Field of Classification Search ............... 365/203, 365/218, 222, 226, 227, 228, 229; 714/1; 713/300, 320, 330; 711/104, 105, 106
See application file for complete search history.

(56) References Cited

U.S. PATENT DOCUMENTS

| | | | | |
|---|---|---|---|---|
| 5,265,231 A | * | 11/1993 | Nuwayser | 711/106 |
| 5,511,033 A | * | 4/1996 | Jung | 365/222 |
| 5,535,169 A | * | 7/1996 | Endo et al. | 365/230.03 |
| 5,627,791 A | | 5/1997 | Wright et al. | 365/222 |
| 5,796,669 A | * | 8/1998 | Araki et al. | 365/222 |
| 5,999,474 A | * | 12/1999 | Leung et al. | 365/222 |
| 2002/0196669 A1 | * | 12/2002 | Hsu et al. | 365/189.04 |

FOREIGN PATENT DOCUMENTS

| | | | | |
|---|---|---|---|---|
| JP | 06111570 A | * | 4/1994 | |
| JP | 07161184 A | * | 6/1995 | |
| JP | 08129881 A | * | 5/1996 | |
| JP | 10-247384 A | | 9/1998 | |
| JP | 2001-332084 A | | 11/2001 | |
| WO | WO 9214251 A1 | * | 8/1992 | |
| WO | WO97/30453 | | 2/1997 | |

\* cited by examiner

*Primary Examiner*—B. James Peikari

(74) *Attorney, Agent, or Firm*—Michael J. LeStrange

(57) ABSTRACT

To provide a DRAM that reduces access latency during refresh and performs refresh for any non-accessed bank in parallel with normal memory accesses. Furthermore, the DRAM allows access to a bank that is undergoing refresh. The DRAM includes a circuit for directing refresh execution by comparing bank address of both access and refresh operations, a circuit for specifying a bank address of the memory cells to be refreshed, a circuit for addressing a row address of the memory cells to be refreshed in the specified bank, a means for refreshing the memory cells, and a means for accessing the memory cells directly after refresh without denying the access request.

4 Claims, 4 Drawing Sheets

DRAM ARCHITECTURE ENABLING REFRESH AND ACCESS OPERATIONS IN THE SAME BANK

BACKGROUND OF INVENTION

1. Field of the Invention

The present invention relates to a DRAM (dynamic random access memory) having multiple banks and a method for refreshing the data stored in the DRAM.

2. Background of the Invention

For DRAM, there is a refresh scheme in which row addresses are sequentially refreshed by updating them periodically using a refresh timer (RT) and a row address counter (RAC). There is also a RAS-Only-Refresh scheme (i.e., normal refresh). FIG. 1 illustrates a schematic diagram of a refresh scheme of the prior art. If there are multiple banks, RAC specifies a bank address R-bank and a row address R-row to be refreshed. The RAC sends a bank address R-bank to a bank selector (BS) and a row address, R-row to a row selector (RS). Another input to BS is a bank address (shown as Bank in FIG. 1) to be accessed. This address has been input to the address input (AI). A row address (shown as Row in FIG. 1) to be accessed, is input to RS from an address that has been input to AI.

BS outputs either the bank address R-bank or bank, while RS outputs either the row address R-row or row. Selection of a combination of the bank and row outputs or the R-bank and R-row outputs is specified by RT. RT comprises a timer circuit and specifies R-bank and R-row outputs at predetermined time intervals. The RT output is also input to a column enable (CE). A column address is input to CE from Al. CE temporarily stops column address output (i.e., column) where R-bank and R-row outputs are specified.

Either a bank, row address and column address to be accessed or a bank and row address to be refreshed are sent to a memory array. Since only one bank address and one row address can reside on their respective busses, only one bank and one row is accessible at any given time. Therefore, in spite of the fact that the remaining banks are not being accessed, they cannot be refreshed simultaneously. Because of the importance of maintaining data integrity, a refresh operation is generally placed at a higher priority level than other memory access functions and, therefore, memory availability and performance degrades.

It is therefore an object of the present invention to provide a DRAM that reduces access latency when refresh occurs.

SUMMARY OF INVENTION

The present invention is a memory refresh circuit and method of executing refresh. The invention includes: a bank circuit for providing bank addresses that correspond to the memory cells to be refreshed, an addressing circuit for addressing row addresses of the memory cells to be refreshed in a specified bank, and an execution circuit for refreshing the specified memory cells. The method performs memory refresh operations on banks, which are currently being accessed and those which are not. Therefore, the refresh operation can operate in parallel with normal read or write accesses. The invention provides a structure and method to utilize the benefits of SRAM architecture within a DRAM circuit topology.

A method for refreshing a DRAM is disclosed in which memory cells are accessed by specifying a bank address, row address and column address, the method includes directing (i.e enabling or signaling) execution of refresh of the memory cells, specifying a bank address of the memory cells to be refreshed, comparing a bank address of the memory cells to be accessed, addressing a row address of the memory cells to be refreshed in the specified bank, refreshing the memory cells of the row address addressed in the specified bank in response to the direction of execution of refresh, storing conflicting row addresses for access to a bank undergoing refresh, and accessing the row addresses in the specified bank directly after refresh without canceling the access request.

DETAILED DESCRIPTION

An embodiment of DRAM and a refresh method for DRAM according to the present invention will be described with reference to FIGS. 2, 3 and 4.

Figure 1:
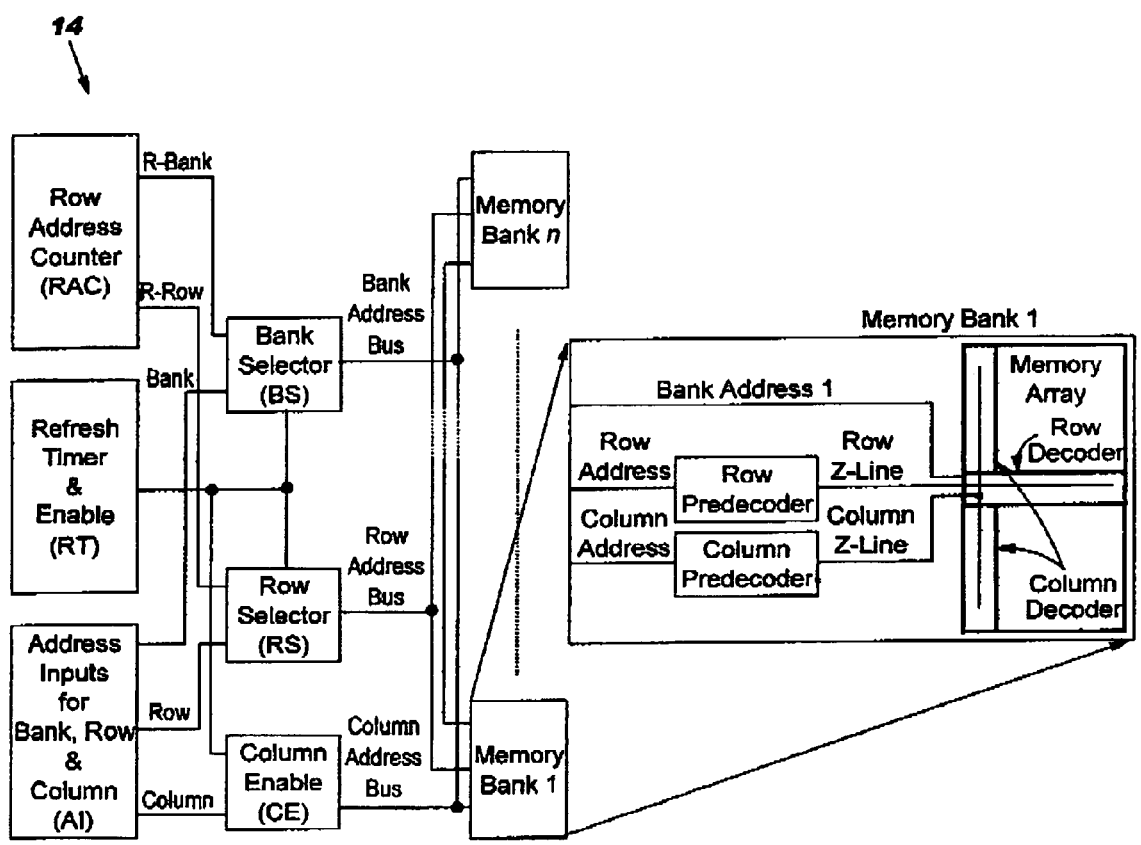
FIG. 1 depicts a block diagram of a conventional DRAM and refresh circuit.
Figure 2:
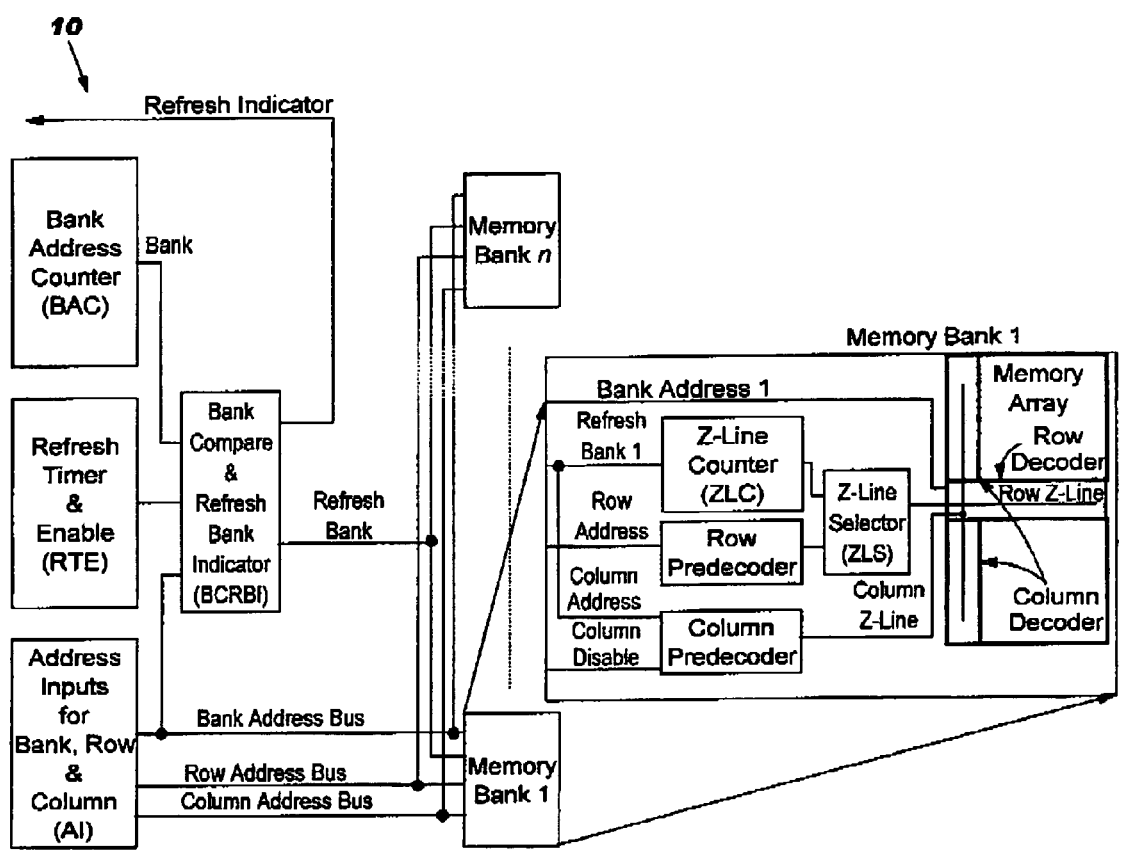
FIG. 2 depicts a block diagram of the DRAM and refresh directing circuit of the present invention.

As shown in FIG. 2, DRAM 10 of the present invention comprises: a refresh directing circuit, which further includes a refresh timer & enable (RTE) integrated circuit for directing execution of refresh (i.e. initiating a refresh operation) and a bank compare & refresh bank indicator (BCRBI) for detecting a match between the bank address to be accessed and the bank address to be refreshed, a bank address counter (BAC) (i.e., bank circuit) for specifying a bank address of memory cells to be refreshed, a Z-line counter (ZLC) (i.e., addressing circuit) for addressing a row address of the memory cells to be refreshed in the specified bank, and an execution circuit for refreshing the memory cells of the row address addressed in the specified bank in response to the direction of execution of refresh from RTE. The execution circuit includes a Z-line selector (ZLS) for selecting the row address to be accessed or the row address to be refreshed based on input from he ZLC, and a column predecoder (CP) for temporarily disabling addressing of the column addresses when the refresh row address is selected.

The BAC logic block has an integrated circuit latch for holding the bank address of the memory cells to be refreshed and an integrated circuit for updating the bank address held in the latch in response to the direction of execution of refresh from RTE.

Figure 3:
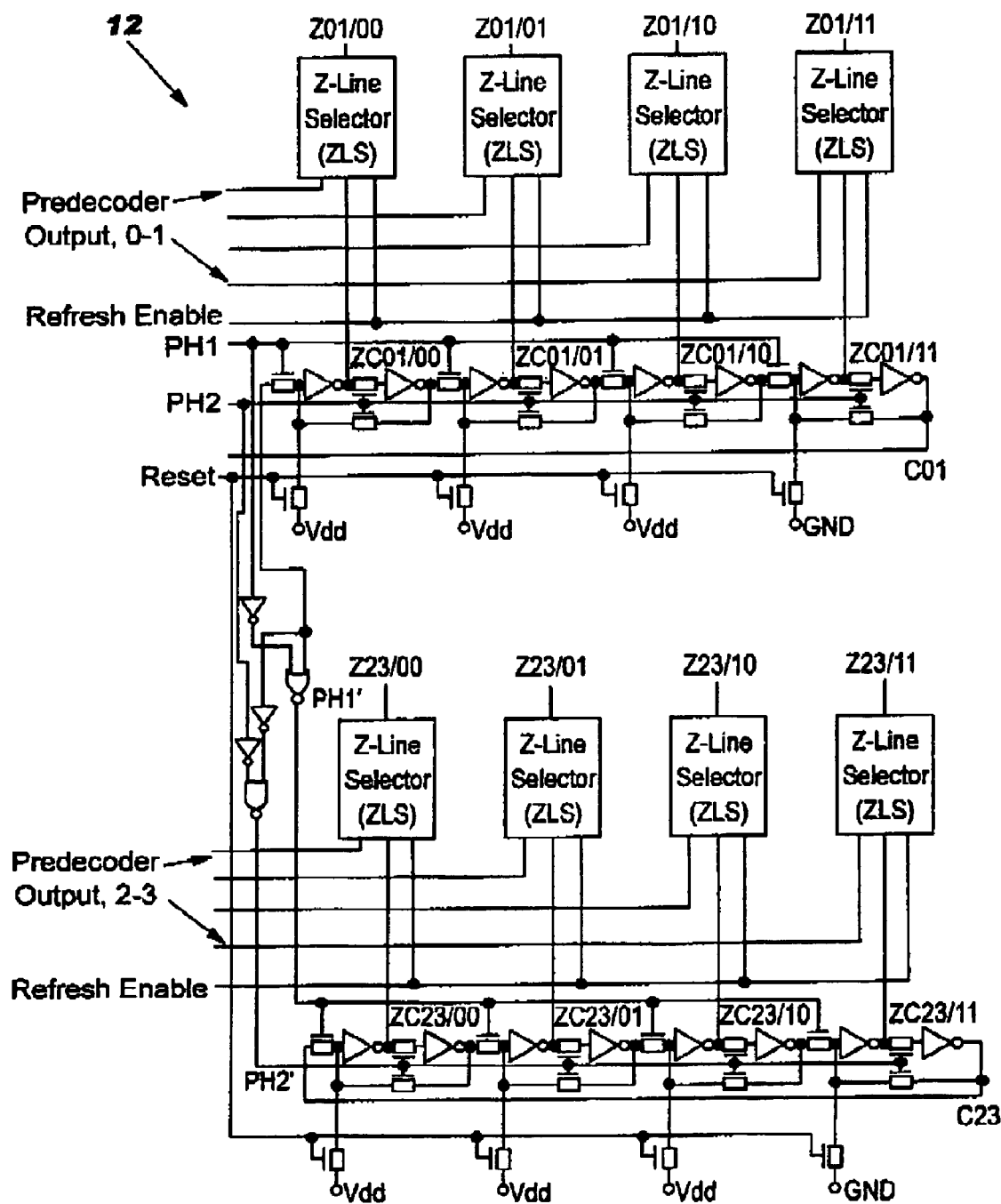
FIG. 3 depicts a circuit diagram of a Z-line counter (ZLC).

The ZLC block, shown in FIGS. 2 and 3, has an integrated circuit latch for holding the row address of the memory cells to be refreshed for each bank and an integrated circuit for updating the row address held in the latch in response to the direction of execution of refresh from RTE.

According to DRAM 10 of the present invention, the row address to be accessed and the row address to be refreshed are selected by ZLS, which is contained in the memory bank (e.g. memory bank 1). The ZLC supplies the row address to be refreshed and a row predecoder (RP) provides the row address to be accessed. A column predecoder (CP) includes a column address to be accessed. The ZLC holds the row address to be refreshed, which is updated whenever refresh is performed. RP and CP hold the row address and column to be accessed, respectively.

An address input for bank row & column (AI) sends the row address and column address input to RP and CP, respectively. AI sends a bank address (that has been requested for access) to each memory bank via a bank address bus. The AI also sends the bank address to the BCRBI. BCRBI is supplied with a signal directing execution of refresh from RTE and a signal specifying a bank to be refreshed from BAC. BCRBI compares the addresses of the bank to be accessed and the bank to be refreshed. The result of the comparison is sent to ZLC and CP in each bank.

When the bank address to be accessed and the bank address to be refreshed do not match, both the refreshed and the access are performed in parallel. The BCRBI sends the address of the bank to be refreshed to the ZLC and to the CP of the corresponding bank to be refreshed, wherein CP temporarily stops the column address output while ZLS selects the row address held in ZLC to refresh. The BCRBI sends the address of the bank to be accessed to the ZLC and CP of the corresponding bank. The corresponding memory cells are accessed according to the row address output from RP, which is selected by ZLS, and the column address output, which is supplied from CP.

When a match is detected, the access and refresh operations are directed to the same bank. At this time, in order to perform the refresh, ZLS selects the row address to be refreshed while CP temporarily stops the column address output. While refresh is performed, the row address and column address to be accessed are held in RP and CP, respectively. When refresh is completed, the row address and column address to be accessed are output from RP and CP, respectively, then ZLS selects the row address to be accessed and an access is performed. BCRBI sends a signal to the memory controller that a match between the banks to be refreshed and accessed has been detected and an access delay is in progress.

Figure 4:
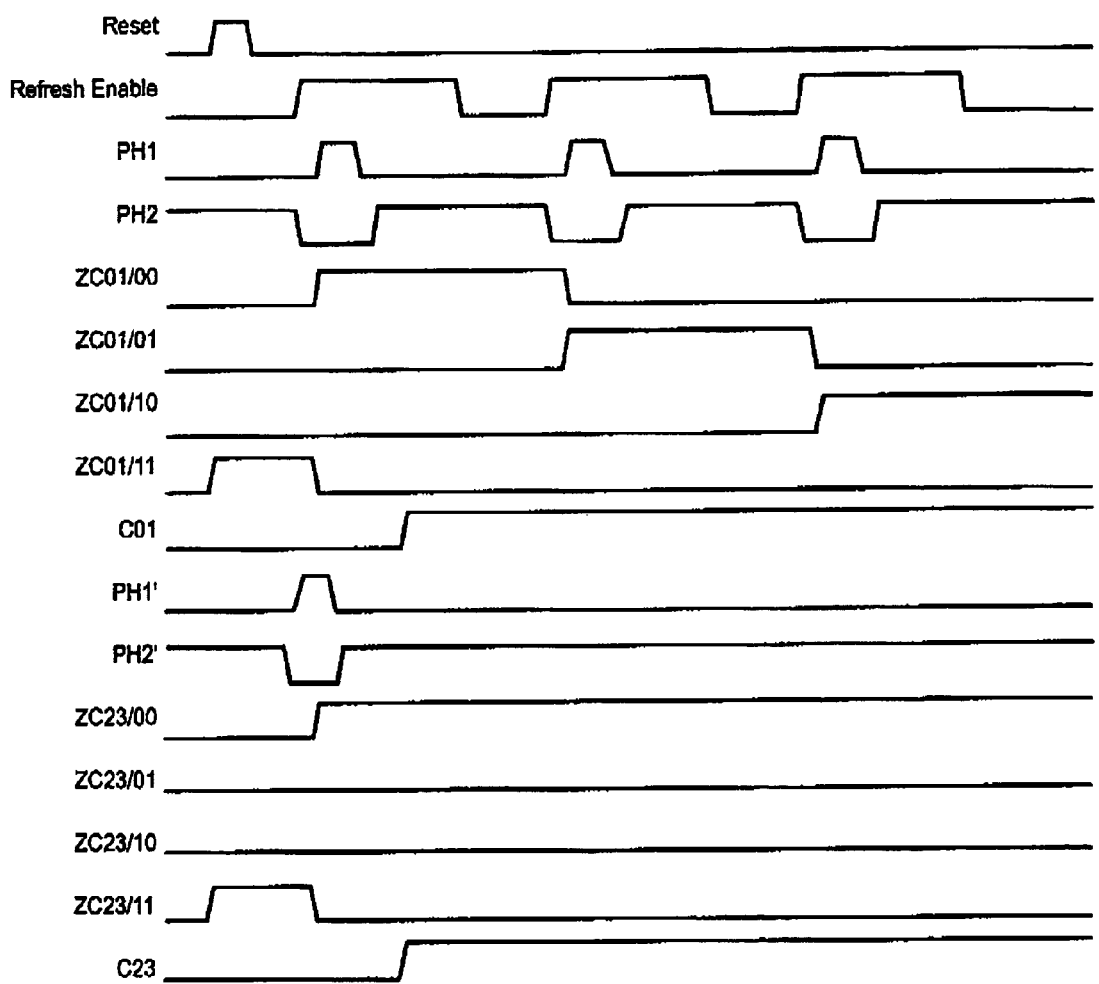
FIG. 4 depicts a timing chart of the circuit shown in FIG. 3.

As shown in FIGS. 3 and 4, the predecoder generates four Z-lines using two bits of the address (predecoder output bits 0–1), wherein only one of four Z-line is high at any given time. When the row address is incremented by one, the asserted Z-line is deasserted and assertion is shifted to the next incremental Z-line. This operates as a counter wherein the asserted Z-line is shifted every refresh.

FIG. 3 illustrates the lower four bits, and it is assumed that a similar circuit is provided in accordance with the total number of row address bits. Reset should initialize the counter to any address and the most significant Z-line for each two bits, such as Z01/11 and Z23/11, is latched high. ZLC is incremented every refresh by the lower two address bits. For higher address bits incrementing is performed only when most significant lower two bits Z-line is high.

In FIG. 4, PH1' and PH2' operate such that Z23/00 through Z23/11 increments only when most significant Z-line Z01/11 for lower bits is high. Therefore, Z01/11 and Z23/11 are selected to be high as an initial value. Note that PH2, PH2' and PH1, PH1' are non-overlap clocks that act on latch function and transfer function, respectively, wherein for the predecoder for lower two bits 0–1, a high level begins from Z01/11 and counts up (i.e., shifts) to Z01/00, Z01/01 and Z01/10 in sequence every refresh as shown in FIG. 4. For higher bits 2–3, counting up such as Z23/11 to Z23/00 is performed only when Z01/11 is high.

According to the aforementioned description, although a bank to be refreshed and timing for refresh are determined in the memory chip, these functions may be provided in the memory controller such that a bank to be refreshed and a bank to be accessed for reading and writing do not conflict with each other.

Next, a refresh method for the DRAM of the present invention will be described. A signal specifying a bank to be refreshed or a bank address, row address and column address externally accessed are supplied to a bank to be refreshed or to be accessed, respectively. An access to a bank specified by AI and refresh of a bank specified by BAC are performed simultaneously.

If the bank to be refreshed and the bank to be accessed match, refresh is preferentially performed. BCRBI informs the memory controller that the access is delayed for one cycle. While refresh is performed, a row address and column address are latched into RP and CP, respectively. When refresh is complete, an access is immediately performed to an address already latched.

In this way, refresh is performed in parallel with normal accesses. When a bank to be refreshed and a bank to be accessed match, refresh and an access are performed in sequence. At this time, the memory controller is informed that the access is delayed for one cycle. When an access to the same bank is continuously performed after refresh, timing for those accesses is delayed for one cycle as well. The effect of refresh operations on normal accesses is kept to a minimum latency, that is, one cycle of access delay due to refresh. As the number of banks increases, the probability of refresh of a bank conflicting with an external access to the same bank decreases, therefore, refresh will be performed while maintaining near zero loss of data transfer rate.

In summary, the present invention allows processing refresh nearly in parallel with data accesses so that refresh is transparent to external devices. Thus it appears as if refresh were not performed, so that the DRAM of the present invention may be used in a manner similar to conventional SRAM.

As mentioned above, according to the present invention, refresh is performed in parallel with normal accesses so that degradation of memory transfer rate due to refresh operations is reduced. Moreover, refresh operations are transparent to external devices, thus the DRAM of the present invention may be utilized like a conventional SRAM and is compatible with SRAM designs.

While the invention has been described in detail, the foregoing description is in all aspects illustrative and not restrictive. It is understood that numerous other modifications and variations can be devised without departing from the scope of the invention.

The invention claimed is:

1. A method for refreshing a DRAM where memory cells are accessed by specifying a bank address, row address and column address, comprising the steps of:
   specifying a first bank of the memory cells to be refreshed;
   comparing said first bank address with a second bank address of memory cells to be accessed;
   refreshing the memory cells of the row address addressed in said first bank; and
   delaying access to the memory cells if said first bank address and said second bank address are equivalent.

2. The method according to claim 1, wherein said bank specifying step comprises the steps of:
   reading the bank address held in said first latch that holds the bank address of the memory cells to be refreshed; and
   updating the bank address held in said first latch after the reading step, and wherein said refreshing step comprises the steps of;
   reading the row address held in said second latch that holds the row address of the memory cells to be refreshed; and updating the row address held in said second latch after said refreshing step.

3. The method according to claim 1, wherein said comparing step comprises the steps of:
   detecting a match between the bank address to be accessed and the bank address to be refreshed;
   selecting the row address to be accessed or the row address to be refreshed based on the match between the bank addresses; and
   temporarily stopping addressing of the column addresses when the row address to be refreshed is selected.

4. The method according to claim 3, wherein said selecting step comprises the steps of:
   selecting and refreshing the row address;
   after said refreshing step, selecting and accessing the row address to be accessed; and
   notifying a memory controller that an access to the row address is delayed.

* * * * *